(12) United States Patent
Vezian et al.

(10) Patent No.: US 11,085,130 B2
(45) Date of Patent: Aug. 10, 2021

(54) METHOD FOR PRODUCING NANOSTRUCTURES

(71) Applicant: CENTRE NATIONAL DE LA RECHERCHE SCIENTIFIQUE, Paris (FR)

(72) Inventors: Stéphane Vezian, Valbonne (FR); Benjamin Damilano, Nice (FR); Julien Brault, Antibes (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 612 days.

(21) Appl. No.: 15/579,910

(22) PCT Filed: Jun. 3, 2016

(86) PCT No.: PCT/EP2016/062721
§ 371 (c)(1),
(2) Date: Dec. 5, 2017

(87) PCT Pub. No.: WO2016/198341
PCT Pub. Date: Dec. 15, 2016

(65) Prior Publication Data
US 2018/0327929 A1 Nov. 15, 2018

(30) Foreign Application Priority Data
Jun. 10, 2015 (FR) ...................................... 1555283

(51) Int. Cl.
*C30B 33/02* (2006.01)
*C30B 29/40* (2006.01)
(Continued)

(52) U.S. Cl.
CPC ............ *C30B 33/02* (2013.01); *C30B 29/406* (2013.01); *C30B 29/60* (2013.01); *H01L 29/22* (2013.01); *B82Y 40/00* (2013.01); *C30B 29/06* (2013.01)

(58) Field of Classification Search
CPC ....... B82Y 40/00; C30B 29/06; C30B 29/406; C30B 29/60; C30B 33/02; H01L 29/22
See application file for complete search history.

(56) References Cited

U.S. PATENT DOCUMENTS 4,926,431 A * 5/1990 Kawanishi ............. B82Y 20/00
372/45.01
5,482,890 A * 1/1996 Liu ................... H01L 21/30621
438/494
(Continued)

FOREIGN PATENT DOCUMENTS

CN 101443887 A 5/2009
CN 102414788 A 4/2012
(Continued)

OTHER PUBLICATIONS

English Translation of Japanese Notice of Rejection issued in Japanese Patent Application No. 2017-563925 dated Apr. 21, 2020.
(Continued)

*Primary Examiner* — Matthew J Song
(74) *Attorney, Agent, or Firm* — BakerHostetler (57) ABSTRACT

A method for producing at least one type of nanostructures comprises the following steps: partially covering a surface of a single-crystal layer or multilayer structure with a discontinuous mask, forming discrete islets having at least one submicrometric lateral dimension and made of a material having an evaporation temperature above that of the layer or multilayer structure; and heating the layer or multilayer structure under vacuum to a so-called etching temperature, above the evaporation temperature of the layer or
(Continued)

multilayer structure but below that of the mask, so as to cause evaporation of the layer or multilayer structure outside of the regions covered by the mask. Structures that may be produced by such a method are also provided.

10 Claims, 6 Drawing Sheets

(51) Int. Cl.
*C30B 29/60* (2006.01)
*H01L 29/22* (2006.01)
*B82Y 40/00* (2011.01)
*C30B 29/06* (2006.01)

(56) References Cited

U.S. PATENT DOCUMENTS

| 5,608,231 | A * | 3/1997 | Ugajin | B82Y 10/00 257/192 |
|---|---|---|---|---|
| 7,745,315 | B1 | 6/2010 | Wang et al. | |
| 2007/0257264 | A1 | 11/2007 | Hersee et al. | |
| 2008/0036038 | A1 | 2/2008 | Hersee et al. | |
| 2010/0221866 | A1 | 9/2010 | Graham et al. | |

FOREIGN PATENT DOCUMENTS

| JP | 2008-143162 A | 6/2008 |
|---|---|---|
| JP | 2009-76795 A | 4/2009 |
| JP | 2009-542560 A | 12/2009 |
| JP | 2010-237539 A | 10/2010 |
| JP | 2012-29756 A | 11/2012 |
| JP | 2013-155111 A | 8/2013 |
| JP | 2014-533430 A | 12/2014 |
| TW | 239894 B | 2/1995 |

OTHER PUBLICATIONS

Kazuma Kurihara et al., "High-speed optical nanofabrication by platinum oxide nano-explosion," Journal of Optics A: Pure and Applied Optics, vol. 8, 2006, pp. S139-S143.
L. Largeau et al., "Facet and in-plane crystallographic orientations of GaN nanowires grown on Si(111)," Nanotechnology, vol. 19, 155704, 2008, pp. 1-5.
S. Hersee et al., "The Controlled Growth of GaN Nanowires," Nano Letters, vol. 6, No. 8, 2006, pp. 1808-1811.
X. L. Li et al., "Thermodynamic theory of growth of nanostructures," Progress Materials Science, vol. 64, 2014, pp. 121-199.
V.G. Dubrovskii et al., "New Mode of Vapor-Liquid-Solid Nanowire Growth," Nano Letters, vol. 11, 2011, pp. 1247-1253.
R. Songmuang et al., "From nucleation to growth of catalyst-free GaN nanowires on thin AlN buffer layer," Applied Physics Letters, vol. 91, 2007, pp. 251902 1-251902 3.
K. K. Sabelfeld et al., "Height self-equilibration during the growth of dense nanowire ensembles: Order emerging from disorder," Applide Physics Letters, vol. 103, 2013, pp. 133105 1-133105 5.
D. Paramanik et al., "Formation of large-area GaN nanostructures with controlled geometry and morphology using top-down fabrication scheme," J. Vac. Sci. Technol. B, vol. 30, No. 5, 2012, pp. 052202 1-052202 13.
English Translation of Chines Office Action issued in Chinese Patent Application No. 201680043103.3 dated Nov. 6, 2019.

* cited by examiner

METHOD FOR PRODUCING NANOSTRUCTURES

CROSS-REFERENCE TO RELATED APPLICATIONS

This application is a National Stage of International patent application PCT/EP2016/062721, filed on Jun. 3, 2016, which claims priority to foreign French patent application No. FR 1555283, filed on Jun. 10, 2015, the disclosures of which are incorporated by reference in their entirety.

FIELD OF THE INVENTION

The invention relates to a method for producing at least one type of nanostructures, in particular of the "nanowire" type, as well as to structures comprising a plurality of such nanostructures and obtainable in particular by such a method. The invention relates notably to the fields of nanoelectronics, sensors, optoelectronics and photonics.

BACKGROUND

For about a decade, semiconductor nanostructures with one dimension (nanowires) or with zero dimension (quantum dots) have been the subject of considerable research and development efforts. This is mainly due to the potential applications in mesoscopic physics and notably for functionalized components in the field of photonics, lasers or biological and chemical sensors. "Nanostructure" means any structure having at least one "submicrometric" dimension, i.e. between 1 nm and 1000 nm, or more restrictively between 1 nm and 100 nm. "Nanowire" means a nanostructure having two dimensions (called transverse or lateral; if these dimensions are approximately equal the term "diameter" can be used) between 1 nm and 1000 (or 100) nm, and one dimension (length) at least ten times greater than the largest transverse dimension. "Quantum dot" means a nanostructure other than a nanowire and having three dimensions between 1 nm and 1000 (or 100) nm. Nanostructures may be incorporated in a matrix or in a nanostructure of larger dimensions, made of a different material. For example, "slices" of a nanowire allowing confinement of charge carriers may constitute quantum dots.

There are numerous techniques for making such nanostructures.

A first approach for producing rectilinear nanowires, oriented perpendicularly to a substrate, is called bottom up. According to this approach, the nanostructures are produced by epitaxial growth on a substrate. This growth can be self-organized using a metal catalyst by the vapor-liquid-solid (VLS) method [1]. A drawback of this method is the risk of metal contamination of the nanostructure—generally semiconducting—by the catalyst. Self-organized growth is also possible without a catalyst, but in this case structural defects are observed, and especially problems of orientation of the nanostructures [2,3]. Moreover, control of the size and position of the nanostructures is still very difficult by this method. To resolve this difficulty, an additional step may be introduced, namely deposition of a dielectric mask [4]. This step, which is carried out prior to growth of the nanostructures, generally requires the use of deposition equipment different from that used for epitaxial growth; this results in risks of contamination on exposure of the sample to the air. It should be noted that the lateral dimension of the nanostructures is limited by the resolution of the lithographic technique used for making the mask, typically about twenty nanometers as a minimum. Furthermore, techniques based on the bottom-up approach do not allow precise control of the length of the nanowires [5].

A second approach for producing rectilinear nanowires oriented perpendicularly to a substrate is called top down. It consists of fabricating the nanostructures starting from one or more epitaxial layers deposited on a substrate beforehand. A mask is then used, and the nanostructures are obtained by etching, most often by dry etching. Besides the problems of resolution associated with the mask (see above), there are also problems during etching. Notably it is difficult to maintain vertical flanks on large thicknesses [6] and therefore to produce nanostructures with a high aspect ratio, i.e. having a diameter of about ten nanometers and a length of several hundred nanometers. Moreover, as with the bottom-up approach, the mask must be made ex-situ, which introduces a risk of contamination of the structure.

The stress relief technique may be used for producing quantum dots on a substrate. This consists of depositing an epitaxial layer of another material, having a different lattice parameter, on the surface of the substrate. Owing to the stresses that develop because of this difference in lattice parameter, the epitaxial layer "fractionates" into islets, forming quantum dots [7]. A drawback of this technique is that the aspect ratio (height/diameter ratio) of the nanostructures thus obtained is necessarily below 1, but poorly controlled; the diameter is also very variable. Furthermore, the quantum dots are not truly isolated, as they are joined together by a very thin epitaxial layer, called "wetting" layer, which is still present after stress relief.

SUMMARY OF THE INVENTION

The invention aims to overcome at least some of the aforementioned drawbacks of the prior art. More particularly it relates to the production of nanostructures whose dimensions, density, as well as control of these parameters cannot be achieved, or only with great difficulty, by the methods known from the prior art. The invention notably relates to the production of nanowires of small diameter (below 10 nm, or even of 5 nm or less) with orientations and advantageously also heights that are well controlled, of quantum dots without a wetting layer and that may reach an aspect ratio very close to 1, of assemblies of nanowires and quantum dots embedded in an epitaxial matrix. According to advantageous embodiments, it also relates to the obtension of nanostructures practically free from impurities. The nanostructures obtained according to the invention are generally made of semiconductor material, but may more generally consist of any crystalline material, typically inorganic, metallic or nonmetallic.

According to the invention, these aims are achieved by using an approach of the top-down type, in which etching is replaced by selective evaporation of the regions of a layer or multilayer structure that are not covered by a mask (this may be called "thermal etching"). Advantageously, the mask may be self-organized; this makes it possible on the one hand to overcome the resolution limitations inherent in lithography, and on the other hand to carry out all the steps of the process in one and the same epitaxy reactor, minimizing the risks of contamination and optimizing the purity and quality of the nanostructures.

Thus, the invention relates to a method for producing at least one type of nanostructures comprising the following steps:

partially covering a surface of a single-crystal layer or multilayer structure with a discontinuous mask, forming discrete islets having at least one submicrometric lateral dimension and made of a material having an evaporation temperature above that of said layer or multilayer structure; and heating said layer or multilayer structure under vacuum to a so-called etching temperature, above the evaporation temperature of said layer or multilayer structure but below that of said mask, so as to cause evaporation of said layer or multilayer structure outside of the regions covered by said mask. In fact, where it is present, the mask stabilizes the surface of the single-crystal layer or multilayer structure and obstructs its evaporation.

According to different embodiments of such a method:

Said single-crystal layer or multilayer structure may have a crystal structure such that its rate of evaporation is higher along crystal planes parallel to said surface than along planes that are inclined or perpendicular relative to said surface.

Said step of partially covering a surface of a single-crystal layer or multilayer structure with a discontinuous mask may be implemented by self-organized growth of said mask on said surface. The method may then also comprise a preliminary step of epitaxial growth of said single-crystal layer or multilayer structure. In this case, in addition:

At least said steps of epitaxial growth of said single-crystal layer or multilayer structure and of deposition of said mask by self-organized growth on said surface may be carried out within one and the same epitaxy reactor; moreover, said step of heating said layer or multilayer structure under vacuum may also be carried out within said epitaxy reactor.

Said steps of epitaxial growth of said single-crystal layer or multilayer structure and of deposition of said mask by self-organized growth on said surface may be carried out by a technique selected from molecular beam epitaxy and vapor phase epitaxy.

Said single-crystal layer or multilayer structure may be deposited on top of a layer, called a barrier layer, having an evaporation temperature above said etching temperature. In this case, moreover, said step of heating said layer or multilayer structure under vacuum may be stopped when there is formation of structures in the form of pyramids having faces corresponding to crystal planes of said layer or multilayer structure and having a said islet of the mask at their apexes. As a variant, said step of heating said layer or multilayer structure under vacuum may be continued until there is formation of structures in the form of pillars having a said islet of the mask at their apexes.

Said layer or multilayer structure may be a multilayer structure comprising at least one quantum well.

The method may also comprise a step of epitaxial growth of a new single-crystal layer or multilayer structure carried out after said step of heating under vacuum. In this case, the method may also comprise, after said step of epitaxial growth of a new single-crystal layer or multilayer structure, partially covering a surface of said new single-crystal layer or multilayer structure with a new discontinuous mask, forming discrete islets having at least one submicrometric lateral dimension and made of a material having an evaporation temperature above that of said new layer or multilayer structure, and heating said new layer or multilayer structure under vacuum to an etching temperature above its evaporation temperature but below that of said mask, so as to cause evaporation of said new layer or multilayer structure outside of the regions covered by the mask.

As a variant, the method may also comprise a step of epitaxial growth of a new single-crystal layer or multilayer structure above said mask, then a step of partially covering a surface of said new single-crystal layer or multilayer structure with a new discontinuous mask, forming discrete islets having at least one submicrometric lateral dimension and made of a material having an evaporation temperature above that of the single-crystal layers or multilayer structures, these steps being followed by said step of heating under vacuum, which is carried out at an etching temperature above the evaporation temperature of said layers or multilayer structures but below that of said masks.

The invention also relates to a structure comprising a plurality of nanowires extending from the surface of a substrate in a direction roughly perpendicular to said surface, a plurality of said nanowires having a first length and another plurality of said nanowires having a second length, different from said first length.

The invention also relates to a structure comprising at least one group of quantum dots in a single-crystal matrix deposited on a planar substrate, the quantum dots of said or of each said group being aligned in a direction roughly perpendicular to said substrate.

The invention also relates to a structure in which the quantum dots of each said group have lateral dimensions decreasing with the distance from said substrate.

The invention also relates to a structure comprising a plurality of nanostructures in the form of a pyramid extending from the surface of a substrate in a direction roughly perpendicular to said surface.

The invention also relates to a structure comprising a plurality of nanowires in an epitaxial matrix, said nanowires being oriented parallel to a direction of epitaxial growth of the matrix.

BRIEF DESCRIPTION OF THE DRAWINGS

Other features, details and advantages of the invention will become clearer on reading the description, referring to the accompanying drawings given as examples, in which.

DETAILED DESCRIPTION

Figure 1A:
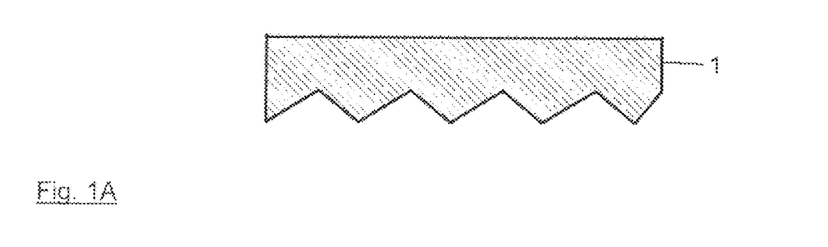
FIGS. 1A to 1E illustrate the various steps of a method according to one embodiment of the invention.
Figure 1B:
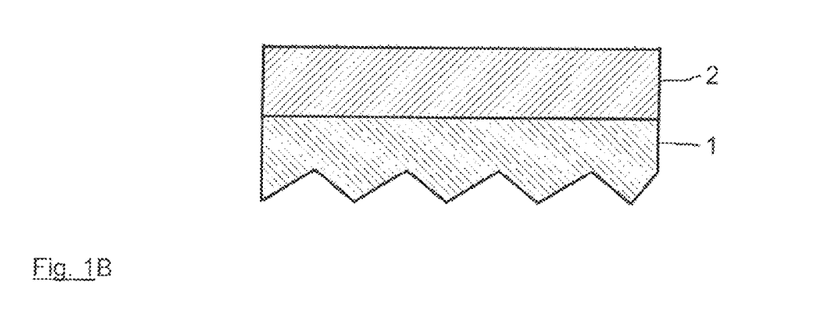
Figure 1C:
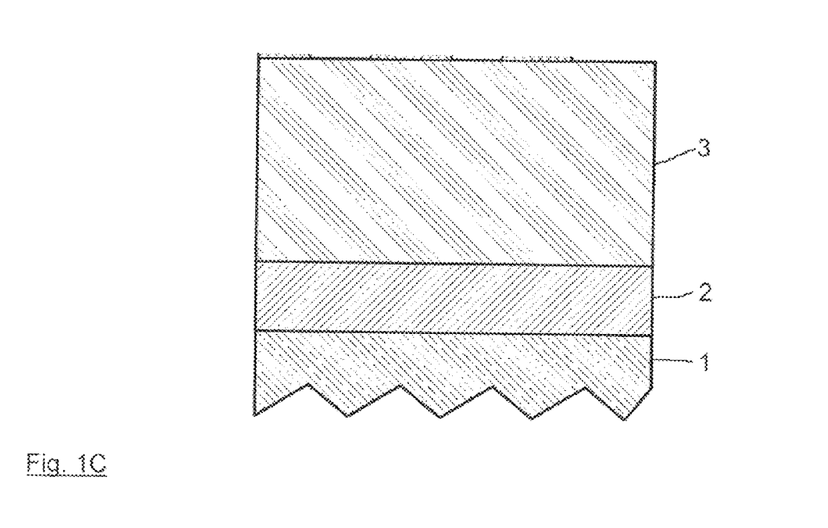
Figure 1D:
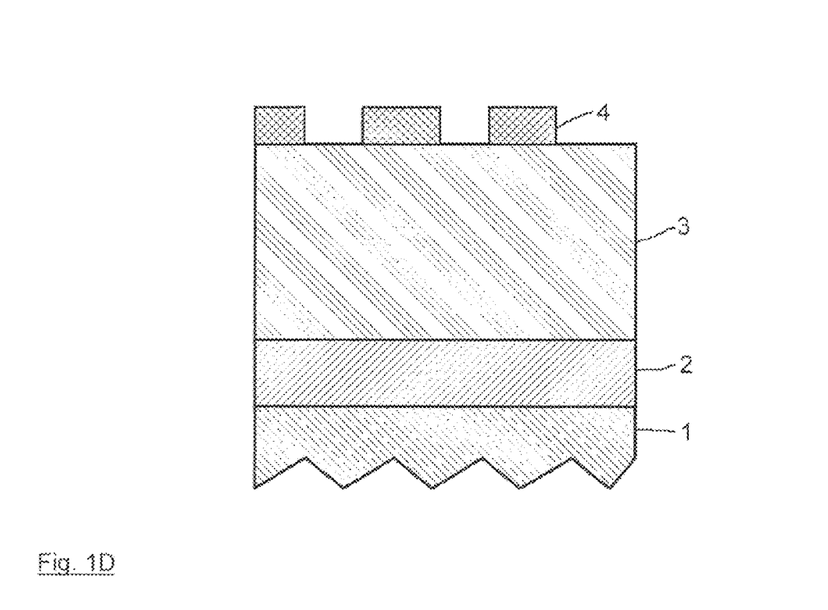

The first steps of a method according to one embodiment of the invention are operations of epitaxial growth of different layers intended to form the nanostructures. Growth is performed two-dimensionally, for example by molecular beam epitaxy in the presence of ammonia (MBE-NH$_3$), or by vapor phase epitaxy. Starting with a "cantilever" specimen 1 (FIG. 1A), which may be for example a massive single-crystal substrate of gallium nitride (GaN) or a thin layer of such a material deposited on another substrate (silicon, sapphire, silicon carbide, zinc oxide), firstly (FIG. 1B) a so-called barrier layer 2 is deposited, for example of Al$_{0.2}$Ga$_{0.8}$N, having a thickness of a few nanometers or even tens of nanometers, for example 20 nm. Secondly (FIG. 1C), a layer or multilayer structure 3 is deposited, from which the nanostructures will be produced; it may be for example a single layer of GaN, or an INGaN/GaN multiple quantum well structure; the thickness of this layer or multilayer structure is roughly equal to the height of the nanostructures to be fabricated; it may therefore be between a few nanometers and several hundred nanometers, or even a micrometer or more. Next (FIG. 1D), a mask 4 is deposited, for example of silicon nitride, which only partially covers the surface of the layer or multilayer structure 3. This can be obtained by stopping the deposition operation at a suitable moment. In fact, deposition of an epitaxial layer (here, the mask 4) on a substrate (here, the layer 3) does not take place uniformly: the atoms or molecules deposited on the substrate group together into islets (self-organized growth) which, if deposition is not interrupted, fuse to form a uniform layer, the thickness of which then begins to increase progressively.

The layer or multilayer structure 3 must have an evaporation temperature $t_3$ below that of layers 2 and 4 ($t_2$, $t_4$ respectively). "Evaporation" means any transition from the solid state to the gas or vapor state; it may be a purely physical process (sublimation) or one involving a chemical reaction (thermal decomposition). Furthermore, the layer or multilayer structure 3 should preferably have a crystal structure such that its rate of evaporation is lower along the vertical crystal planes (parallel to the direction of growth) than along the horizontal crystal planes (parallel to the surface on which deposition is effected) or inclined crystal planes. This condition is not particularly restrictive: for a given composition of the layer or multilayer structure 3, it can be satisfied simply by a suitable choice of the crystal orientation of the cantilever 1.

For example, the cantilever 1 may be a layer of nitride of elements III, gallium nitride GaN, aluminum nitride AlN or indium nitride InN. It may also be an alloy of nitrides of elements III, (Al,Ga)N, (In,Ga)N, (Al,In)N or (Ga,Al,In)N. The layer or multilayer structure to be evaporated 3 may be gallium nitride GaN and the mask 4 may be silicon nitride SiN. In this case, the barrier layer 2 may be an alloy of aluminum nitride and gallium nitride (Al,Ga)N. However, other combinations are conceivable: for example, the layer or multilayer structure may be an alloy of indium nitride and gallium nitride (In,Ga)N, the mask 4 may be silicon nitride SiN, or else an alloy of aluminum nitride and gallium nitride (Al,Ga)N. It should be noted that, especially if the evaporation temperature of the cantilever 1 is high enough (above that of the layer or multilayer structures 3), the barrier layer 2 may be omitted. In any case, at least the materials of layers 1, 2 (if present) and 3 must be monocrystalline and have lattice parameters compatible with the epitaxial growth of the structure.

Figure 1E:
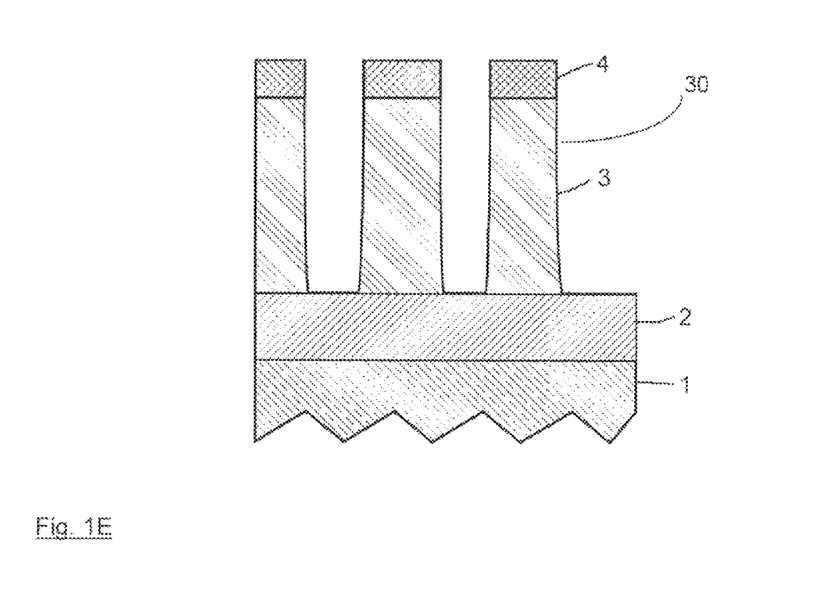

The next step of the method (FIG. 1E) is the operation of "thermal etching". It may preferably be carried out in the same epitaxy reactor as that used in the growth steps, but the specimen may also be transferred to another vessel, for example a controlled-atmosphere annealing furnace. The specimen (the structure formed by layers 1 to 4) is heated under vacuum to a temperature t above the evaporation temperature of the layer or multilayer structure, but below that of the barrier layer 2 (or cantilever 1, if layer 2 is absent) and of the mask 4: $t_3 < t < \min(t_2, t_4)$. As mentioned above, the mask stabilizes the layer or multilayer structure 3 locally; thus, only the regions of the layer or multilayer structure 3 not covered by the mask evaporate, leaving just pillars or vertical nanowires 30 bearing an islet of the mask 4 on their apex. Etching stops when the evaporation front reaches the barrier layer 2.

In a particular embodiment of the invention, all the fabrication steps are carried out in a molecular beam epitaxy reactor. The system is equipped with conventional solid-source evaporation cells for gallium and aluminum. It is also provided with an ammonia line, which makes it possible to obtain atomic nitrogen by pyrolysis of the NH$_3$ molecule in contact with the growth surface of the specimen. Another solid-source evaporation cell, containing silicon, is used for type n doping of the nitrides of elements III. The specimen temperature is measured using an infrared pyrometer. The growth temperature is 800° C. The system has in addition an electron gun for diffraction of high-energy electrons at grazing incidence (RHEED). The cantilever layer 1, surface of which is a (0001) plane, is of GaN. The barrier layer with a thickness of 10 nm is of Al$_x$Ga$_{1-x}$N with a 20% aluminum composition (x=0.2). The layer to be evaporated 3 is of GaN and has a thickness of 60 nm. The mask 4 is produced by exposing the specimen to streams of ammonia and silicon simultaneously. The ammonia stream is 100 sccm (cubic centimeters per minute in standard conditions) and the silicon doping cell is brought to a temperature of 1250° C. The exposure time is typically of the order of 5 minutes.

During the step of evaporation, or thermal etching, the ammonia stream is switched off and the specimen is heated to a temperature between 850° C. and 900° C. The development of the surface can be monitored in real time by means of RHEED, as illustrated in FIGS. 2A to 2D. Each of these figures presents an idealized three-dimensional representation of the surface (part on the left) and the corresponding RHEED image (part on the right).

Figure 2A:
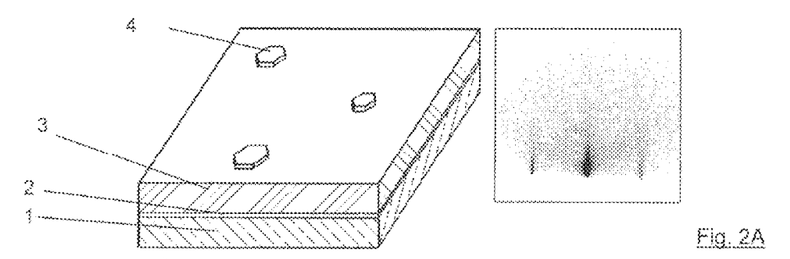
FIGS. 2A to 2E illustrate in more detail the progress of the selective evaporation step of such a method.
Figure 2B:
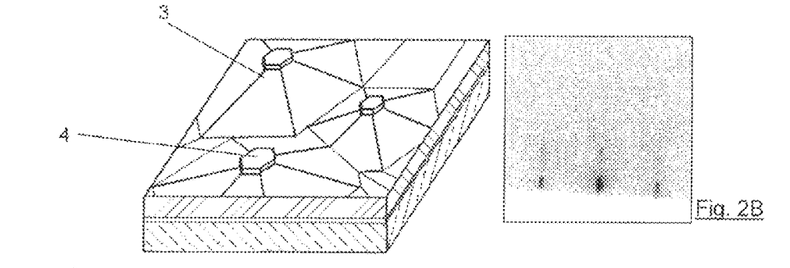
Figure 2C:
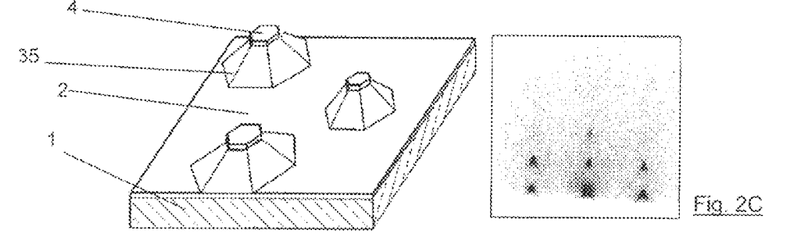
Figure 2D:
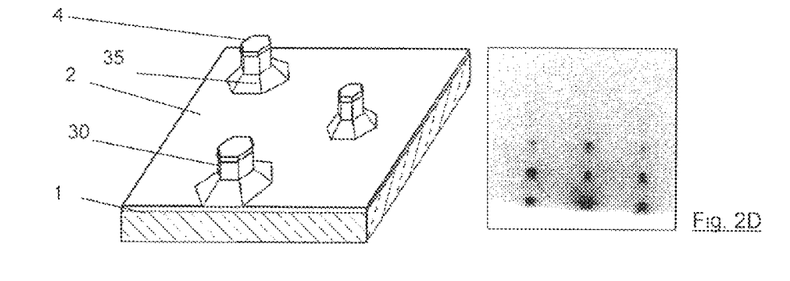
Figure 2E:
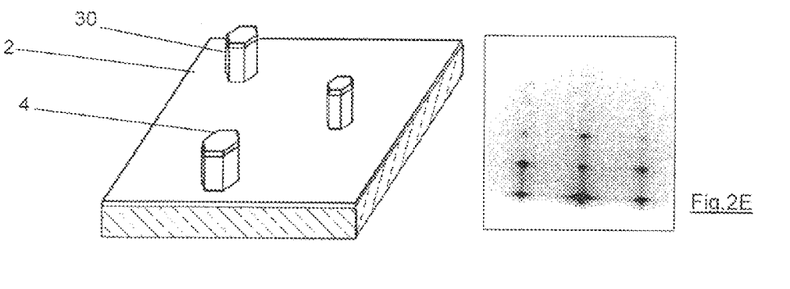

At the start (FIG. 2A) the surface is two-dimensional and vertical lines are observed on the RHEED image. When evaporation begins (FIG. 2B), the image develops into a diagram consisting of points, characteristic of the diffraction of a three-dimensional surface. Then chevrons characteristic of the diffraction by facets appear on the RHEED image (FIG. 2C). By measuring the angle of the chevrons it is possible to determine the nature of the facets, here {1-103} planes. The facets form pyramids 35 with a hexagonal base, which on evaporation release vertical {1-100} planes. These planes surround the masked zones and form nanowires 30. This is reflected in the RHEED image by the presence of horizontal lines (FIG. 2D). Finally, toward the end of evaporation (FIG. 2E), the pyramids disappear completely; only the nanowires 30 are left. The coexistence of vertical lines (diffraction arising from the barrier layer, which has a two-dimensional morphology) and horizontal lines (diffraction by nanowires) is now observed on the RHEED image.

Figure 3A:
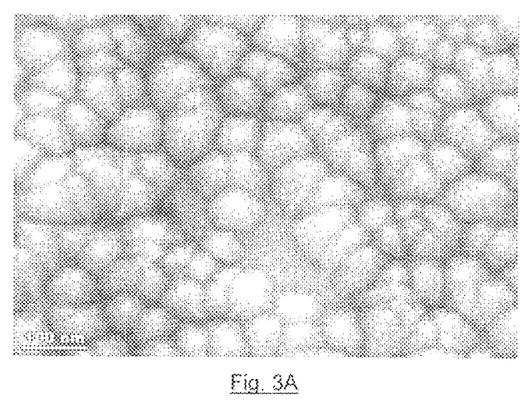
FIGS. 3A, 3B and 3C are scanning electron microscope images corresponding to FIGS. 2C to 2E, respectively.
Figure 3B:
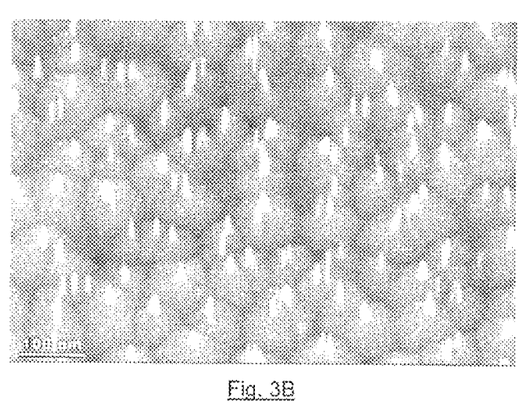
Figure 3C:
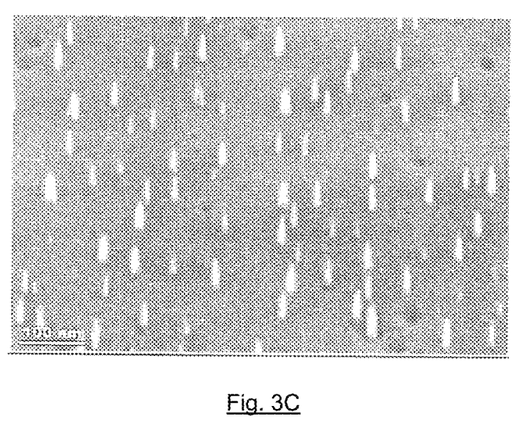

The step of thermal etching may be stopped at different stages to produce objects of different shapes and nanometric sizes. This is illustrated by FIGS. 3A to 3C, which are images obtained by scanning electron microscopy (SEM). FIG. 3A shows hexagonal-based pyramids, corresponding to FIG. 2C. In FIG. 3B there is simultaneous presence of pyramids and nanowires, as in FIG. 2D. Finally, FIG. 3C shows nanowires, corresponding to FIG. 2E.

The dimensions of the pyramids are directly related to the thickness h of the layer to be evaporated 3. The height of the pyramids is equal to h. The faces of the pyramids make an angle θ with the growth surface. The base of the pyramids is inscribed in a circle whose diameter is equal to 2h/tan(θ). For example, in the case when the layer to be evaporated 3 is of GaN, with a thickness h of 60 nm, the angle θ is 35 degrees and the pyramids have a base of 170 nm. Regarding the nanowires, their diameter varies from 5 to 20 nm; this depends on the diameter of the islets forming the discontinuous mask 4.

Figure 4:
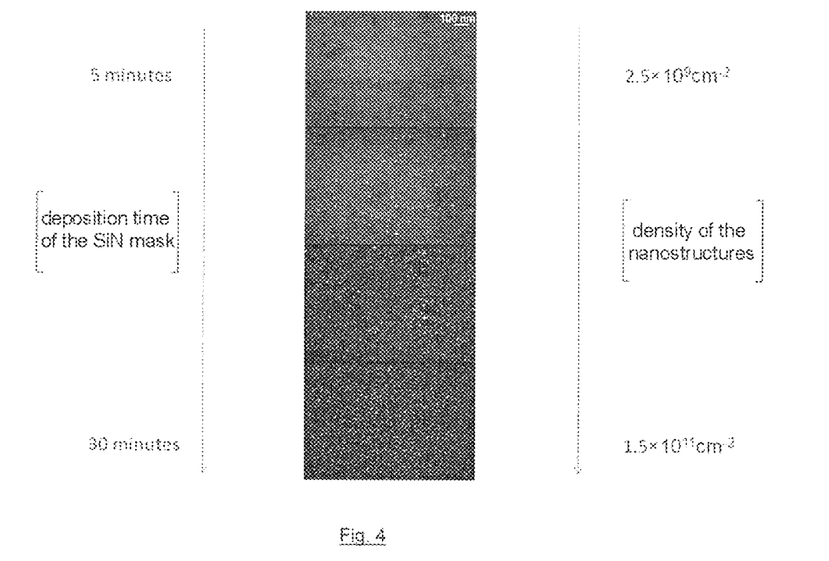
FIG. 4 illustrates the variation in the nanowire density obtainable by controlling the time of growth of the self-organized mask.

It is possible to vary the nanowire density over several orders of magnitude. This depends on the amount of Si deposited on the surface of the layer to be evaporated 3 during formation of the mask 4. FIG. 4 shows SEM images corresponding to specimens where the exposure time was varied from 5 minutes (top) to 30 minutes (bottom). The density of the islets of the mask 4, and therefore of the nanowires, thus ranges from $2.5 \times 10^9$ cm$^{-2}$ to $1.5 \times 10^{11}$ cm$^{-2}$. This is therefore a simple and very effective way of controlling the density of nanostructures.

The method described above supplies a structure consisting of a plurality of nanostructures (nanowires or pyramids) projecting from the surface of a specimen. As all the steps are carried out inside an epitaxy reactor, and etching is carried out thermally, there is no contamination of the surface of the structure; it is thus possible to carry out new epitaxial growth on top of it, to encapsulate the nanostructures in a single-crystal matrix 300.

Figure 5:
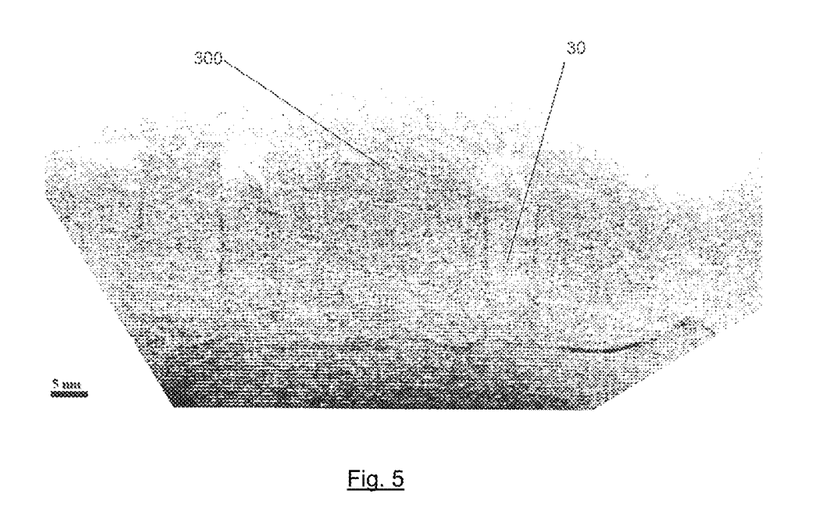
FIG. 5 is a transmission electron microscope image showing a sectional view of a structure according to one embodiment of the invention, consisting of nanowires in an epitaxial matrix.

FIG. 5 shows a transmission electron microscope image (cross section) of GaN nanowires 30 encapsulated in a layer of (Al,Ga)N 300 deposited after the thermal etching step. The surface roughness of this encapsulating layer, or matrix, 300 is very low, of the order of 0.6 nm (measured by atomic force microscopy). It is therefore possible to transition from a two-dimensional (2D) morphology to a three-dimensional (3D) morphology comprising pyramids or nanowires and return to a 2D morphology. It is in fact far easier for epitaxy and fabrication of components to use 2D layers, and this property is therefore very advantageous. The invention therefore makes it possible to shape nanostructures for their particular physical properties but also to integrate them in a matrix, facilitating the technological processes necessary for fabrication of components. FIG. 5 also shows that the nanowires 30 have an excellent crystalline quality: no defects are observed inside the nanowires, at the interface between the latter and the (Al,Ga)N barrier layer, or at the interface between the nanowires and the encapsulating layer.

Figure 6A:
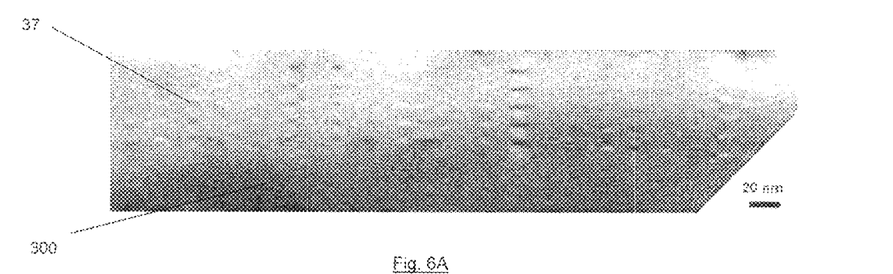
FIG. 6A is a transmission electron microscope image showing a sectional view of a structure according to one embodiment of the invention, consisting of stacks of quantum dots in an epitaxial matrix.

FIG. 6A illustrates the structure that can be obtained starting from a structure to be evaporated 3 of the multiple quantum well type, consisting of alternating layers of (In, Ga)N with a thickness of 3 nm (the quantum wells) and of GaN. After thermal etching, nanowires are obtained containing quantum dots; then a new epitaxial deposition of GaN is carried out. The nanowires are "absorbed" by the encapsulating matrix 300, as they consist of the same material; thus, disks of (In,Ga)N 37 are obtained, embedded in a matrix of GaN 300, for example having a thickness of 3 nm and a diameter between 5 and 10 nm and therefore getting close to "perfect" quantum dots: they do not comprise a wetting layer and the lateral and vertical dimensions are almost identical and give rise to quantum effects of confinement of the charge carriers in the three dimensions of space.

Figure 6B:
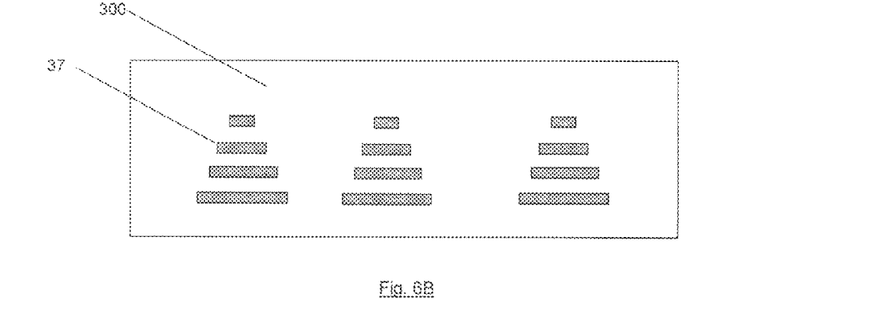
FIG. 6B illustrates schematically a variant of the structure in FIG. 6A.

If thermal etching is stopped at the stage of pyramids (FIGS. 2C and 3A), stacks of nanodisks 37 having a variable diameter as a function of the depth can be obtained in the same way; this is illustrated schematically in FIG. 6B.

Figure 7:
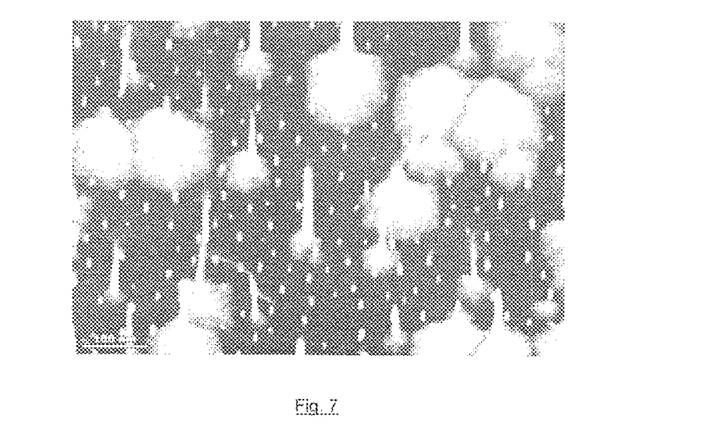
FIG. 7 is a scanning electron microscope image showing a sectional view of a structure according to another embodiment of the invention, consisting of two populations of nanowires with different heights extending from the surface of a substrate.

The invention also makes it possible to produce nanostructures of different natures and sizes on one and the same support. For this, nanowires can be produced first, for example of GaN, with a first height, for example 15 nm, using the method in FIGS. 2A to 2E. These nanowires are then encapsulated, for example by the growth of 200 nm of GaN. This matrix constitutes the layer to be evaporated 3 in a second application of the method. This time, evaporation is stopped so as to produce pyramids comprising a nanowire at their apexes. The result obtained can be seen in the SEM image in FIG. 7, illustrating the coexistence of nanowires of small height and of pyramids having a longer nanowire located at their apexes. Of course, it would also have been possible to complete the second thermal etching to obtain two populations of nanowires of different heights without pyramid structures. It is also possible to repeat these operations several times. Furthermore, if the second layer to be evaporated has the same composition as the first (the case considered here), the first operation of evaporation is optional; therefore a first mask can be deposited, then a second layer to be evaporated, a second mask and a single evaporation can be carried out, at the end of which the two populations of nanowires are obtained.

The invention has been described with reference to certain embodiments, but several variants are conceivable. For example:

Molecular beam epitaxy may be replaced with other techniques, such as vapor phase epitaxy.

In the examples considered, the mask 4 was made of insulating material. This is not essential, it may be any material compatible with the layer to be evaporated 3 and having a higher evaporation temperature. Typically it will be a single-crystal, polycrystalline or amorphous inorganic material.

The mask 4 may be structured by lithography instead of being self-organized;

this allows better control of the lateral dimensions and spatial distribution of the nanostructures, but increases the risk of contamination (it is difficult, or impossible, to perform lithography inside an epitaxy reactor) and reduces the performance in terms of miniaturization.

As mentioned above, the barrier layer 2 may be absent, notably if the cantilever 1 has sufficient thermal stability (ability to keep its structure intact when its temperature rises, which is greater the greater the evaporation temperature) or if thermal etching is stopped early enough. In the latter case, however, there will be poorer control of the height h of the nanostructures.

REFERENCES

[1] V. G. Dubrovskii et al., Nano. Lett. 11, 1247 (2011).
[2] L. Largeau et al., Nanotechnology 19, 155704 (2008).
[3] R. Songmuang et al., Appl. Phys. Lett. 91, 251902 (2007).
[4] S. D. Hersee et al., Nano. Lett. 6, 1808 (2006).
[5] K. K. Sabelfeld et al., Appl. Phys. Lett. 103, 133105 (2013).
[6] D. Paramanik et al., J. Vac. Sci. Technol. B 30, 052202 (2012).
[7] X. L. Li et al., Prog. Mater. Sci. 64, 121 (2014).

The invention claimed is:

1. A method for producing at least one type of nanostructures, comprising the following steps:
   epitaxial growth of a single-crystal layer or multilayer structure;
   partially covering a surface of said single-crystal layer or multilayer structure with a discontinuous mask, forming discrete islets having at least one submicrometric lateral dimension and made of a material having an evaporation temperature above that of said single-crystal layer or multilayer structure; and
   heating said single-crystal layer or multilayer structure under vacuum to a so-called etching temperature, above the evaporation temperature of said single-crystal layer or multilayer structure but below that of said mask, so as to cause evaporation of said layer or multilayer structure outside of the regions covered by said mask,
   wherein said step of partially covering a surface of a single-crystal layer or multilayer structure with a discontinuous mask is implemented by self-organized growth of said mask on said surface,
   wherein said single-crystal layer or multilayer structure is deposited on top of a barrier layer having an evaporation temperature above said etching temperature,
   wherein said step of heating said single-crystal layer or multilayer structure under vacuum is stopped when there is formation of structures in the form of pyramids having faces corresponding to crystal planes of said single-crystal layer or multilayer structure and having a said islet of the mask at their apexes.

2. The method as claimed in claim 1, wherein said single-crystal layer or multilayer structure has a crystal structure such that its rate of evaporation is higher along crystal planes parallel to said surface than along planes that are inclined or perpendicular relative to said surface.

3. The method as claimed in claim 1, wherein at least said steps of epitaxial growth of said single-crystal layer or multilayer structure and of deposition of said mask by self-organized growth on said surface are carried out inside one and the same epitaxy reactor.

4. The method as claimed in claim 3, wherein said step of heating said single-crystal layer or multilayer structure under vacuum is also carried out inside said epitaxy reactor.

5. The method as claimed in claim 1, wherein said steps of epitaxial growth of said single-crystal layer or multilayer structure and of deposition of said mask by self-organized growth on said surface are carried out by a technique selected from molecular beam epitaxy and vapor phase epitaxy.

6. The method as claimed in claim 1, wherein said step of heating said single-crystal layer or multilayer structure under vacuum is continued until there is formation of structures in the form of pillars having said islet of the mask at their apexes.

7. The method as claimed in claim 1, wherein said single-crystal layer or multilayer structure is a multilayer structure comprising at least one quantum well.

8. The method as claimed in claim 1, also comprising a step of epitaxial growth of a new single-crystal layer or multilayer structure that is carried out after said step of heating under vacuum.

9. The method as claimed in claim 8, also comprising, after said step of epitaxial growth of a new single-crystal layer or multilayer structure, partially covering a surface of said new single-crystal layer or multilayer structure with a new discontinuous mask, forming discrete islets having at least one submicrometric lateral dimension and made of a material having an evaporation temperature above that of said new layer or multilayer structure, and heating said new layer or multilayer structure under vacuum to an etching temperature above its evaporation temperature but below that of said mask, so as to cause evaporation of said new layer or multilayer structure outside of the regions covered by the mask.

10. The method as claimed in claim 1, also comprising a step of epitaxial growth of a new single-crystal layer or multilayer structure on top of said mask, then a step of partially covering a surface of said new single-crystal layer or multilayer structure with a new discontinuous mask, forming discrete islets having at least one submicrometric lateral dimension and made of a material having an evaporation temperature above that of the single-crystal layers or multilayer structures, these steps being followed by said step of heating under vacuum, which is carried out at an etching temperature above the evaporation temperature of said layers or multilayer structures but below that of said masks.

* * * * *